United States Patent
Stewart

(10) Patent No.: US 10,064,285 B2
(45) Date of Patent: Aug. 28, 2018

(54) DRILL BIT FOR USE IN FORMING HOLES IN PRINTED CIRCUIT BOARDS

(71) Applicant: Perfect Point Precision Carbide Tools Inc., Mississauga (CA)

(72) Inventor: Shane Hugh Stewart, Belfountain (CA)

(73) Assignee: Perfect Point Precision Carbide Tools Inc., Mississauga, Ontario (CA)

( * ) Notice: Subject to any disclaimer, the term of this patent is extended or adjusted under 35 U.S.C. 154(b) by 0 days.

(21) Appl. No.: 15/380,179

(22) Filed: Dec. 15, 2016

(65) Prior Publication Data

US 2018/0177054 A1    Jun. 21, 2018

(51) Int. Cl.
| B23B 35/00 | (2006.01) |
| B23B 41/14 | (2006.01) |
| H05K 3/00 | (2006.01) |
| B23B 51/02 | (2006.01) |

(52) U.S. Cl.
CPC .......... *H05K 3/0047* (2013.01); *B23B 51/02* (2013.01); *B23B 35/00* (2013.01); *B23B 41/14* (2013.01); *B23B 2251/043* (2013.01); *B23B 2251/046* (2013.01); *B23B 2251/426* (2013.01); *B23B 2251/44* (2013.01)

(58) Field of Classification Search
CPC ......... B23B 35/00; B23B 41/14; B23B 51/02; B23B 2251/043; B23B 2251/046; B23B 2251/44; H05K 3/0047
See application file for complete search history.

(56) References Cited

U.S. PATENT DOCUMENTS

| 4,561,813 A * | 12/1985 | Schneider | B23B 51/02 408/228 |
| 5,584,617 A * | 12/1996 | Houser | B23B 51/02 408/1 R |
| 2003/0082020 A1* | 5/2003 | Lin | B23B 51/02 408/144 |
| 2012/0039680 A1* | 2/2012 | Koike | B23B 51/02 408/1 R |

FOREIGN PATENT DOCUMENTS

| EP | 2058073 A1 * | 5/2009 | ............ B23B 51/02 |
| JP | 2011212804 A * | 10/2011 | |
| JP | 5474227 B2 * | 4/2014 | |

OTHER PUBLICATIONS

Machine translation, Japan patent document, JP 2011-212804A, Hoshi et al., Oct. 27, 2011.*

\* cited by examiner

*Primary Examiner* — Daniel Howell
*Assistant Examiner* — Chwen-Wei Su
(74) *Attorney, Agent, or Firm* — Rowand LLP

(57) ABSTRACT

A drill bit for use in forming holes in a printed circuit board (PCB) is disclosed. The drill bit includes a drill bit body having: a drill bit tip at a first end of the drill bit body; a flute winding about the drill bit body in a helix, wherein a helix angle of the flute is between 44 and 46 degrees in the vicinity of the first end and increases with increasing distance from the first end to between 49 and 51 degrees; and a land width of between 0.08 and 0.1 millimeters.

12 Claims, 5 Drawing Sheets

DRILL BIT FOR USE IN FORMING HOLES IN PRINTED CIRCUIT BOARDS

TECHNICAL FIELD

The present disclosure relates to drill bits and, in particular, to twist drill bits capable of forming through-holes in printed circuit boards (PCBs).

BACKGROUND

Printed circuit boards usually contain a plurality of holes having small diameters (e.g. approximately 1 millimeter or less) that are made conductive, for example, by electroplating or inserting metal eyelets, to electrically connect board layers. Some of the holes on the PCB may be used to accommodate insertion of through-hole component leads. For example, walls of holes for boards with two or more layers can be made conductive and electroplated with electrically conducting material (e.g. copper) to form plated-through holes. These holes may electrically connect the conducting layers of the PCB.

In order to properly provide electrical connections among various chips, chip holders, or other components that may be attached to a PCB, it is important that the PCB holes are drilled with high degree of accuracy and are uniform in their dimensions.

BRIEF DESCRIPTION OF DRAWINGS

Reference will now be made, by way of example, to the accompanying drawings which show example embodiments of the present application and in which.

Like reference numerals are used in the drawings to denote like elements and features.

DETAILED DESCRIPTION OF EXAMPLE EMBODIMENTS

In one aspect, the present disclosure describes a drill bit for use in forming holes in a printed circuit board (PCB). The drill bit includes a drill bit body having: a drill bit tip at a first end of the drill bit body; a flute winding about the drill bit body in a helix, wherein a helix angle of the flute is between 44 and 46 degrees in the vicinity of the first end and increases with increasing distance from the first end to between 49 and 51 degrees; and a land width of between 0.08 and 0.1 millimeters.

In another aspect, the present disclosure describes a drill. The drill includes a drill body, a drill bit, and a fastening mechanism for attaching the drill bit to the drill body. The drill bit includes a drill bit body having: a drill bit tip at a first end of the drill bit body; a flute winding about the drill bit body in a helix, wherein a helix angle of the flute is between 44 and 46 degrees in the vicinity of the first end and increases with increasing distance from the first end to between 49 and 51 degrees; and a land width of between 0.08 and 0.1 millimeters.

In yet another aspect, the present disclosure describes a method of forming holes in a PCB. The method includes providing a drill bit including a drill bit body having: a drill bit tip at a first end of the drill bit body; a flute winding about the drill bit body in a helix, wherein a helix angle of the flute is between 44 and 46 degrees in the vicinity of the first end and increases with increasing distance from the first end to between 49 and 51 degrees; and a land width of between 0.08 and 0.1 millimeters. The method further includes rotating the drill bit; bringing the drill bit tip into contact with a surface of the PCB; and forming a hole in the PCB by moving at least one of the drill bit and the PCB in a direction parallel to the longitudinal axis of the drill bit such that the drill bit penetrates through the PCB.

Other example embodiments of the present disclosure will be apparent to those of ordinary skill in the art from a review of the following detailed descriptions in conjunction with the drawings.

Figure 1:
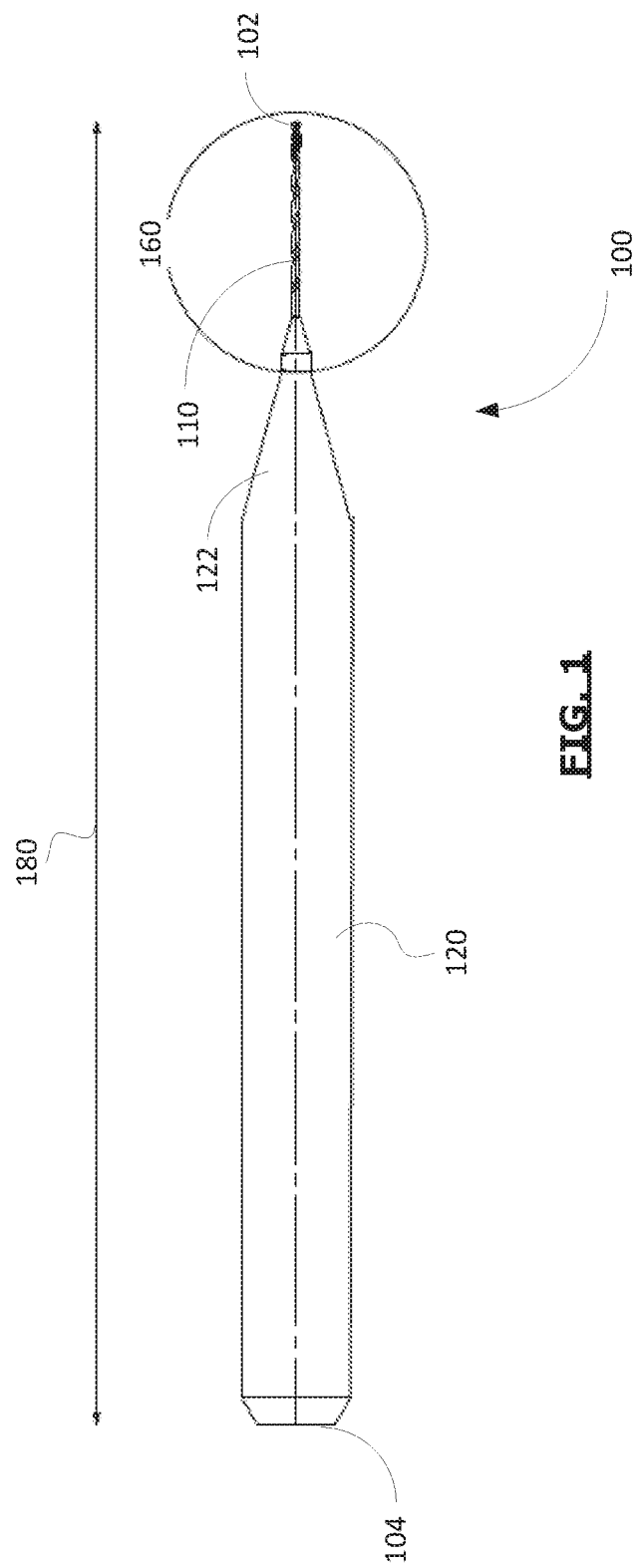
FIG. 1 is a side view of an example drill bit in accordance with example embodiments of the present disclosure.

Reference is first made to FIG. 1, which shows an example drill bit 100. The drill bit 100 can be used in forming holes in a single layer or multiple layers of printed circuit boards (PCBs). The drill bit 100 includes a first end 102, a drill bit body 110, and a second end 104 which is opposed to the first end 102. The drill bit body 110, which includes the drill point, or the cutting end of the drill bit, is located at the first end 102. The second end 104 accommodates attachment to a drilling apparatus. In particular, an apparatus for rotating the drill bit 100 may be coupled to the drill bit 100 at or in the vicinity of the second end 104.

The drill bit 100 also includes a shank portion 120. The shank portion 120 extends between the drill bit body 110 and the second end 104. In at least some embodiments, a drilling apparatus may engage the shank portion 120 to secure the drill bit 100 to the drilling apparatus. For example, at least a part of the shank portion 120 may be gripped by a chuck of a drilling machine when the drilling machine is fitted with the drill bit 100. As shown in FIG. 1, in some embodiments, the diameter of the shank portion 120 may be greater than the diameter of the drill bit body 110. Accordingly, the drill bit 100 may include a neck 122 which is interposed between the drill bit body 110 and the shank portion 120. For example, the neck 122 may have a frusto-conical shape, as in the example of FIG. 1. The overall length of the drill bit 100 may vary depending on the particular drilling application for which the drill bit 100 is used. In at least some embodiments, the length 180 of the drill bit 100 may be between 38.02 and 38.18 millimeters. In a first example embodiment, the length of the drill bit 100 is 38.1 millimeters.

Figure 2:
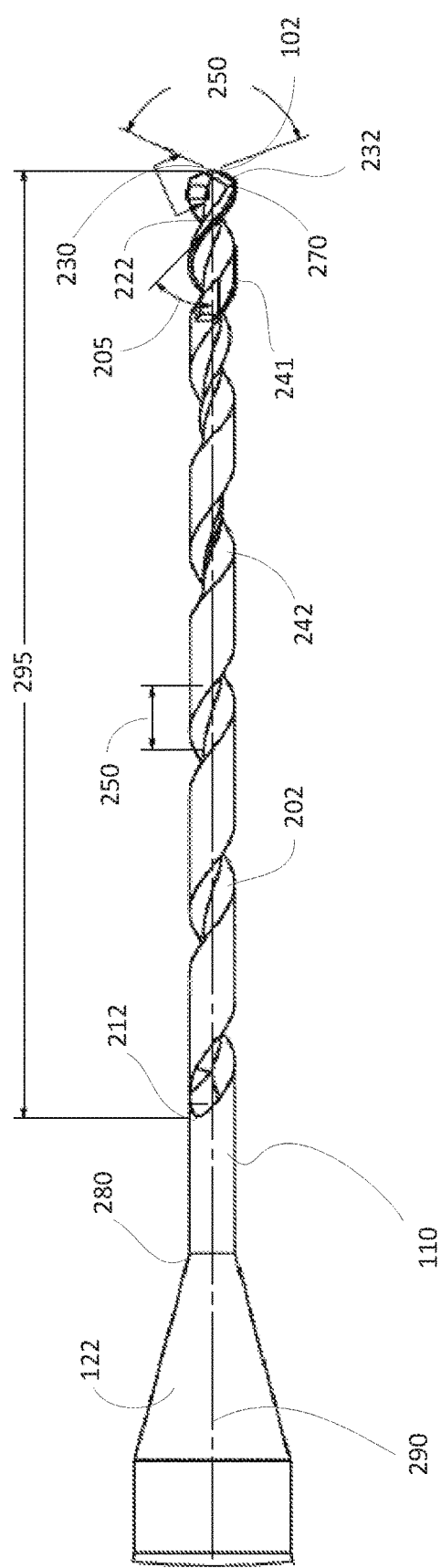
FIG. 2 is an enlarged side view of the drill bit body of the example drill bit of FIG. 1.

FIG. 2 shows an exploded view of portion 160 (shown in FIG. 1) of the drill bit body 110. The drill bit body 110 includes a drill point 270, which is the cutting end of the drill bit 100, and a body end 280 near the shank portion 120. The drill point 270 includes a drill bit tip 230, cutting lips 232, and a chisel edge connecting the cutting lips 232. The cutting lips 232 define a point angle 250. The point angle 250 refers to the angle included between the cutting lips projected on a plane that is parallel to the longitudinal axis 290 and the cutting lips 232. In at least some embodiments, the point angle 250 may be between 128 and 132 degrees. In the first example embodiment, the point angle is 130 degrees.

The drill bit body 110 includes a flute 202. The flute 202 is a helical groove formed in the drill bit body 110 to provide cutting edges, to permit removal of chips, and, in some embodiments, to allow cutting fluid to reach the cutting edges. The flute 202 extends away from the first end 102 of the drill bit 100 towards a flute runout 212. More specifically, the flute 202 winds about the drill bit body 110 in a helix. In at least some embodiments, the length 295 of the flute 202, or the distance from the first end 102 to the flute runout 212, may be between 5.15 and 5.25 millimeters. In the first example embodiment, the flute 202 may have a length of 5.2 millimeters. The effective flute length, or the maximum working length of the flute 202, may be between 5.05 and 5.15 millimeters, and preferably 5.1 millimeters.

The flute 202 may be described by the magnitude of the angle (i.e. helix angle 205) formed by a line parallel to the helix of the flute 202 and the longitudinal axis 290 of the drill bit 100. In the vicinity of the first end 102, the helix angle 205 is between 44 and 46 degrees. In particular, when measured at a point on the drill bit body 110 that is within 1.25 millimeters of the drill bit tip 230, the helix angle 205 is between 44 and 46 degrees. In the first example embodiment, the helix angle 205 is 45 degrees. The angle between the helix of the flute 202 and the longitudinal axis 290 increases along the length of the drill bit body 110 with increasing distance from the first end 102 of the drill bit 100. In particular, the helix angle is greater at a second point 242 than at a first point 241, where the second point 242 is further away from the first end 102 than the first point 241. For example, in the example of FIG. 2, the helix angle at a second point 242, which is at least 2.5 millimeters away from the first end 102, may be between 49 and 51 degrees; in particular, in the first example embodiment, the helix angle is 50 degrees at the point 242. In some cases, the helix angle may vary continuously throughout the entire length of the flute 202; in some other cases, the helix angle may remain constant for certain portions along the drill bit body 110. For example, the helix angle at a third point that is at least 3.75 millimeters away from the first end 102 may be the same as the value of the helix angle at the point 242.

The flute 202 may also be described by its width 250, or the distance between opposed edges of the flute 202. In at least some embodiments, the flute width 250 may be between 0.265 and 0.365 millimeters at a point 252 on the drill bit body 110 that is 3 millimeters away from the drill bit tip 230. In the first example embodiment, the flute width 250 is 0.315 millimeters at the point 252.

The land, or the peripheral portion of the drill bit body 110 between adjacent flutes 202, can be described by its width. Specifically, the land width 222 refers to the distance between a leading edge and a heel of the land. The land width 222 of the drill bit body 110 is maintained at between 0.08 and 0.1 millimeters. In the first example embodiment, the land width 222 is 0.09 millimeters. The land width 222 may vary along the length of the drill bit body 110. For example, the land width 222 may increase with increasing distance from the drill bit tip 230.

Figure 3:
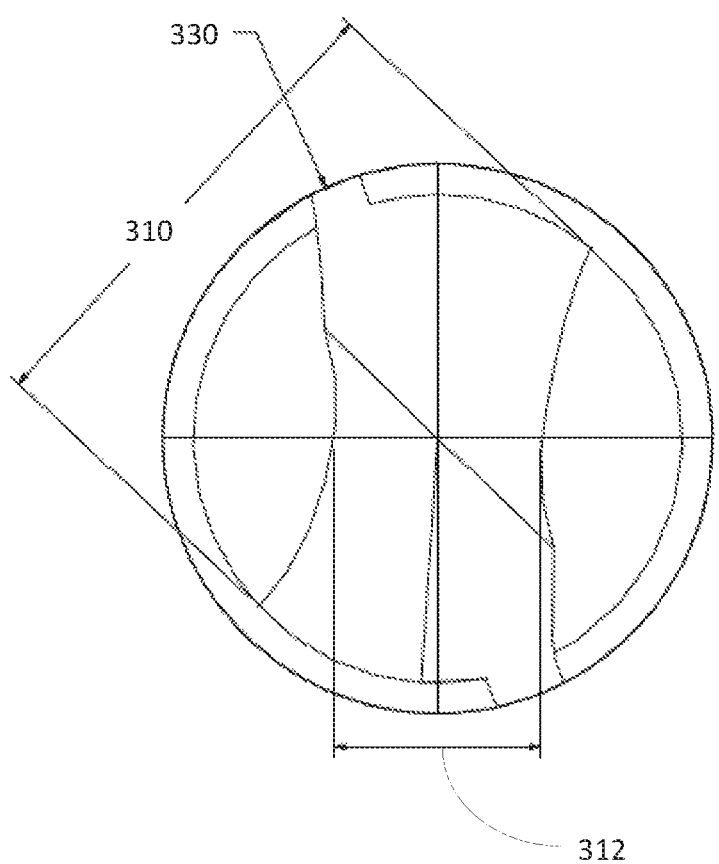
FIG. 3 is a bottom plan view of the drill point of the example drill bit shown in FIG. 1.

Reference is made to FIG. 3, which shows a bottom plan view of the drill point of the drill bit 100 of FIG. 1. In at least some embodiments, the drill bit body 110 (not shown in FIG. 3) has a diameter 310 of between 0.251 and 0.261 millimeters. In the first example embodiment, the diameter 310 of the drill bit body 110 is 0.256 millimeters. The diameter 310 may taper from the drill point towards the body end.

FIG. 3 shows a web which is a central portion of the drill bit body 110 that joins the lands. The thickness 312 of the web may increase along the drill bit body 110 from the drill point to the flute runout 212 of FIG. 2. In some embodiments, the web thickness 312 may be between 0.08 and 0.12 millimeters at a point 318 on the drill bit body 110 that is 0.5 millimeters from the drill bit tip 230. In the first example embodiment, the web thickness 312 is 0.1 millimeters at the point 318. The web thickness may increase from the drill point 270 to the body end 280 (of FIG. 2). Table 1 below provides a listing of possible values of web thickness at different points along the drill bit body 110:

TABLE 1

| Distance from drill bit tip (in millimeters) | Web thickness (in millimeters) | Tolerance (in millimeters) |
|---|---|---|
| 0.7 | 0.11 | 0.02 |
| 1.5 | 0.135 | 0.02 |
| 2.5 | 0.15 | 0.02 |
| 4.5 | 0.195 | 0.02 |

The drill bit 100 includes a single margin 330. In at least some embodiments, the margin 330 has a width 360 of between 0.017 and 0.037 millimeters. In the first example embodiment, the margin 330 has a width of 0.027 millimeters. In at least some embodiments, the margin 330 has a depth of between 0.215 and 0.235 millimeters. The margin depth refers to the depth of a cutaway portion which allows debris to be evacuated up the body of the drill bit. In the first example embodiment, the margin 330 has a width of 0.225 millimeters.

The drill bit 100 defines a relief, or clearance, from the cutting edge to the back of the land, which may be produced by a cam actuated cutting tool or grinding wheel during tool manufacturing. In at least some embodiments, the length of the relief may be between 0.67 and 0.73 millimeters. For example, in an embodiment, the relief length may be 0.7 millimeters. The drill bit 100 also defines a head length, or the distance of the drill measured from the tip where the body of the drilling tool reduces in diameter, of between 0.5 and 0.6 millimeters. For example, the head length may be 0.55 millimeters in some embodiments.

Figure 4:
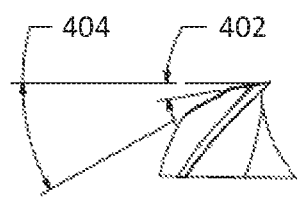
FIG. 4 is an isolated view of the drill bit tip of the example drill bit of FIG. 1.

FIG. 4 shows an isolated view of the drill bit tip 230 of the drill bit 100 of FIG. 1. FIG. 4 illustrates a primary cutting angle 402 and a secondary cutting angle 404. The primary cutting angle 402 is an angle subtended between a flute tip surface and a plane 410 (not shown in FIG. 4) which is perpendicular to the longitudinal axis of the drill bit 100. The secondary cutting angle 404 is an angle subtended between a flute edge surface and the plane 410. In at least some embodiments, the primary cutting angle 402 may be between 8 and 12 degrees and the secondary cutting angle may be between 28 and 32 degrees. In the first example embodiment, the primary cutting angle 402 is 10 degrees and the secondary cutting angle is 30 degrees.

Figure 5:
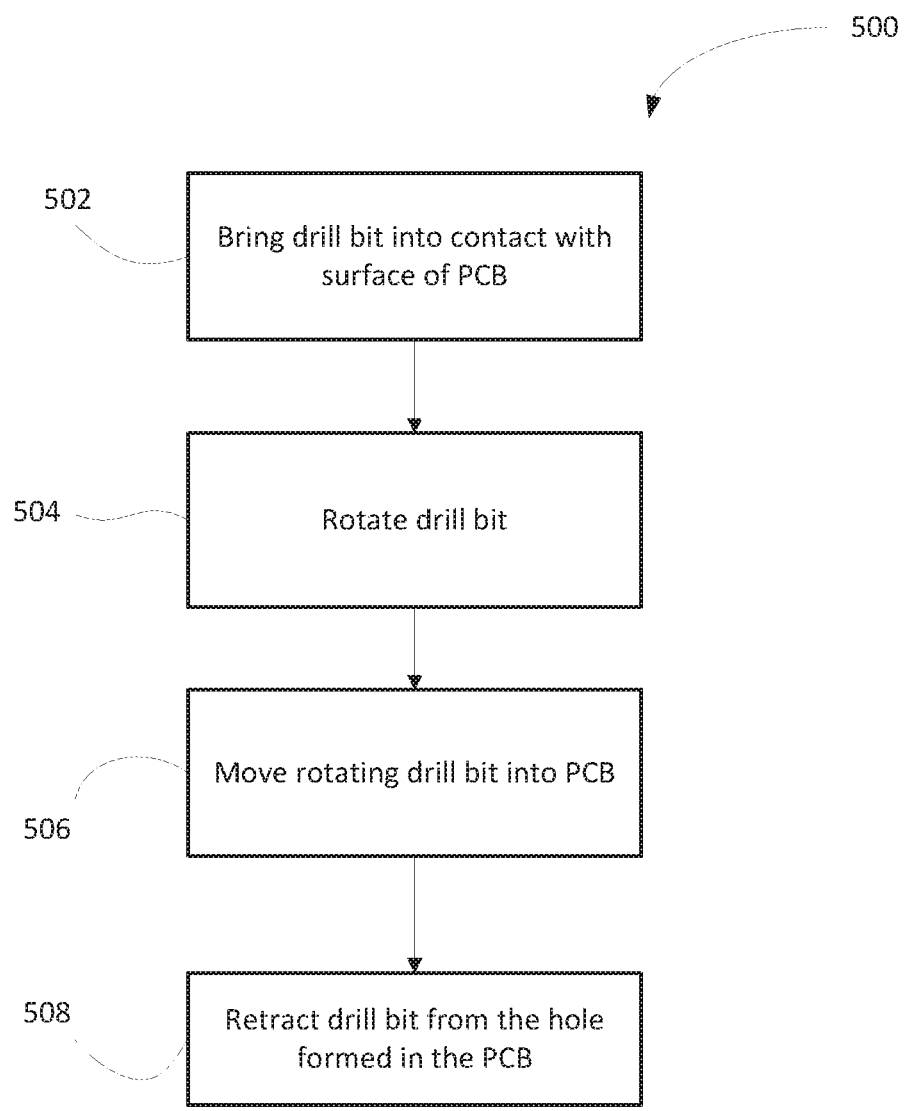
FIG. 5 shows, in flowchart form, an example method 400 for forming holes in a PCB.

Reference is now made to FIG. 5, which shows, in flowchart form, an example method 500 for forming one or more holes in printed circuit boards (PCBs). The method 500 may be performed by using a drill bit for high speed, high aspect ratio drilling, such as the drill bit 100 of FIG. 1. For example, a drilling machine that is fitted with the drill bit as described above may be caused to perform the method 500.

In order to prevent a drill from being knocked off course or burring of a PCB, an entry material may be placed over the area of a PCB where a hole is to be drilled. For example, a standard sheet (e.g. approximately 0.007 inches thick) of solid aluminum may be used as the entry material, with a standard wood core as a backing during the drilling process.

In operation 502, the drill bit is brought into contact with the surface of the PCB at a location where a hole is desired to be formed. The drill bit may be moved towards the PCB surface or the PCB may be moved towards the drill bit. In operation 504, the drill bit is caused to rotate. The drill bit may commence rotating either before or after making contact with the surface of the PCB. In at least some embodiments, the drill bit may be rotated at a rate between 103,000 and 110,000 revolutions per minute. In the first example embodiment, the rotation speed of a drill spindle may be 107,000 revolutions per minute. The drill bit may be rotated in a clockwise or counterclockwise direction.

In operation 506, at least one of the drill bit and the PCB is moved towards each other in a direction parallel to the longitudinal axis of the drill bit, moving the drill bit into the PCB and causing it to penetrate through the PCB. In at least some embodiments, the infeed rate, or the rate of descending the drill bit to penetrate the PCB, may be between 80 and 85 inches per minute. In the first example embodiment, the infeed rate may be 83 inches per minute.

In operation 508, the drill bit and the PCB are moved away from each other. Specifically, the drill bit may be retracted from the PCB in a direction parallel to the longitudinal axis of the drill bit, thereby removing the drill bit from the hole formed in the PCB. In at least some embodiments, the drill bit may be retracted at a rate of between 510 and 690 inches per minute. In the first example embodiment, the retract rate is 600 inches per minute.

The various embodiments presented above are merely examples and are in no way meant to limit the scope of this application. Variations of the innovations described herein will be apparent to persons of ordinary skill in the art, such variations being within the intended scope of the present application. In particular, features from one or more of the above-described example embodiments may be selected to create alternative example embodiments including a sub-combination of features which may not be explicitly described above. In addition, features from one or more of the above-described example embodiments may be selected and combined to create alternative example embodiments including a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

The invention claimed is:

1. A drill bit for use in forming holes in a printed circuit board (PCB), the drill bit comprising:
   a drill bit body having:
      a drill bit tip at a first end of the drill bit body;
      a flute winding about the drill bit body in a helix, wherein a helix angle of the flute is between 44 and 46 degrees in the vicinity of the first end and increases with increasing distance from the first end to between 49 and 51 degrees; and
      a land width of between 0.08 and 0.1 millimeters,
   wherein the drill bit body has a web thickness of between 0.08 and 0.12 millimeters at a point on the drill bit that is axially spaced from the drill bit tip by 0.5 millimeters,
   and wherein the drill bit body has a web thickness of between 0.09 and 0.13 millimeters at a point on the drill bit that is axially spaced from the drill bit tip by 0.7 millimeters,
   and wherein the drill bit body has a web thickness of between 0.115 and 0.155 millimeters at a point on the drill bit that is axially spaced from the drill bit tip by 1.5 millimeters,
   and wherein the drill bit body has a web thickness of between 0.13 and 0.17 millimeters at a point on the drill bit that is axially spaced from the drill bit tip by 2.5 millimeters,
   and wherein the drill bit body has a web thickness of between 0.175 and 0.215 millimeters at a point on the drill bit that is axially spaced from the drill bit tip by 4.5 millimeters.

2. The drill bit of claim 1, wherein the drill bit body has a margin width of between 0.017 and 0.037 millimeters.

3. The drill bit of claim 1, wherein the flute has a length of between 5.15 and 5.25 millimeters.

4. The drill bit of claim 1, wherein the drill bit body has a point angle of between 128 and 132 degrees.

5. The drill bit of claim 1, wherein the drill bit body has a diameter of between 0.251 and 0.261 millimeters.

6. The drill bit of claim 1, further comprising a shank portion extending away from the drill bit body.

7. The drill bit of claim 1, wherein a total length of the drill bit is between 38.02 and 38.18 millimeters.

8. A method of forming holes in a printed circuit board (PCB), comprising:
   providing a drill bit including a drill bit body having:
      a drill bit tip at a first end of the drill bit body;
      a flute winding about the drill bit body in a helix, wherein a helix angle of the flute is between 44 and 46 degrees in the vicinity of the first end and increases with increasing distance from the first end to between 49 and 51 degrees; and
      a land width of between 0.08 and 0.1 millimeters,
   rotating the drill bit;
   bringing the drill bit tip into contact with a surface of the PCB; and
   forming a hole in the PCB by moving at least one of the drill bit and the PCB in a direction parallel to the longitudinal axis of the drill bit such that the drill bit penetrates through the PCB,
      wherein the drill bit body has a web thickness of between 0.08 and 0.12 millimeters at a point on the drill bit that is axially spaced from the drill bit tip by 0.5 millimeters,
      and wherein the drill bit body has a web thickness of between 0.09 and 0.13 millimeters at a point on the drill bit that is axially spaced from the drill bit tip by 0.7 millimeters,
      and wherein the drill bit body has a web thickness of between 0.115 and 0.155 millimeters at a point on the drill bit that is axially spaced from the drill bit tip by 1.5 millimeters,
      and wherein the drill bit body has a web thickness of between 0.13 and 0.17 millimeters at a point on the drill bit that is axially spaced from the drill bit tip by 2.5 millimeters,
      and wherein the drill bit body has a web thickness of between 0.175 and 0.215 millimeters at a point on the drill bit that is axially spaced from the drill bit tip by 4.5 millimeters.

9. The method of claim 8, wherein the drill bit is rotated at a rate of between 103,000 and 110,000 revolutions per minute.

10. The method of claim 8, wherein forming the hole in the PCB comprises descending the drill bit into the PCB at a rate of between 80 and 85 inches per minute.

11. The method of claim 10, wherein forming the hole in the PCB further comprises, after descending the drill bit through the PCB, retracting the drill bit at a rate of between 510 and 690 inches per minute.

12. A drill comprising:
a drill body;
a drill bit including a drill bit body having:
- a drill bit tip at a first end of the drill bit body;
- a second end which is attachable to the drill body, the second end being opposite the first end;
- a flute winding about the drill bit body in a helix, wherein a helix angle of the flute is between 44 and 46 degrees in the vicinity of the first end and increases with increasing distance from the first end to between 49 and 51 degrees; and
- a land width of between 0.08 and 0.1 millimeters, and
- a fastening mechanism for attaching the second end of the drill bit body to the drill body,
- wherein the drill bit body has a web thickness of between 0.08 and 0.12 millimeters at a point on the drill bit that is axially spaced from the drill bit tip by 0.5 millimeters,
- and wherein the drill bit body has a web thickness of between 0.09 and 0.13 millimeters at a point on the drill bit that is axially spaced from the drill bit tip by 0.7 millimeters,
- and wherein the drill bit body has a web thickness of between 0.115 and 0.155 millimeters at a point on the drill bit that is axially spaced from the drill bit tip by 1.5 millimeters,
- and wherein the drill bit body has a web thickness of between 0.13 and 0.17 millimeters at a point on the drill bit that is axially spaced from the drill bit tip by 2.5 millimeters,
- and wherein the drill bit body has a web thickness of between 0.175 and 0.215 millimeters at a point on the drill bit that is axially spaced from the drill bit tip by 4.5 millimeters.

\* \* \* \* \*